US 6,596,604 B1

(12) United States Patent
Lojek et al.

(10) Patent No.: US 6,596,604 B1
(45) Date of Patent: Jul. 22, 2003

(54) METHOD OF PREVENTING SHIFT OF ALIGNMENT MARKS DURING RAPID THERMAL PROCESSING (75) Inventors: Bohumil Lojek, Colorado Springs, CO (US); Michael D. Whiteman, Woodland Park, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/201,093

(22) Filed: Jul. 22, 2002

(51) Int. Cl.$^7$ ............................................... H01L 21/76
(52) U.S. Cl. ......................... 438/401; 438/462; 438/975
(58) Field of Search .................................. 438/401, 462, 438/975

(56) References Cited

U.S. PATENT DOCUMENTS

| 3,836,745 | A | | 9/1974 | Costello ...................... 219/85 |
| 4,534,804 | A | | 8/1985 | Cade ........................... 148/1.5 |
| 4,632,724 | A | | 12/1986 | Chesebro et al. ........... 156/626 |
| 4,732,646 | A | | 3/1988 | Elsner et al. ............... 156/626 |
| 4,936,930 | A | * | 6/1990 | Gruber et al. ............. 148/33.2 |
| 4,968,637 | A | | 11/1990 | Mozzi et al. .................. 437/40 |
| 5,000,818 | A | | 3/1991 | Thomas et al. ............. 156/643 |
| 5,252,510 | A | * | 10/1993 | Lee et al. .................... 438/401 |
| 5,382,551 | A | | 1/1995 | Thakur et al. .............. 437/247 |
| 5,399,523 | A | | 3/1995 | Kakoschke ................. 437/173 |
| 5,688,710 | A | * | 11/1997 | Lu ............................. 438/401 |
| 5,851,929 | A | | 12/1998 | Thakur et al. .............. 438/795 |
| 5,861,609 | A | | 1/1999 | Kaltenbrunner et al. .... 219/390 |
| 5,985,764 | A | | 11/1999 | Lin et al. ..................... 438/692 |
| 6,077,751 | A | | 6/2000 | Marcus et al. .............. 438/308 |
| 6,159,873 | A | | 12/2000 | Takagi ......................... 438/795 |
| 6,207,529 | B1 | | 3/2001 | Jost et al. .................... 438/401 |
| 6,214,707 | B1 | | 4/2001 | Thakur et al. .............. 438/513 |
| 6,239,031 | B1 | | 5/2001 | Kepler et al. ................ 438/692 |
| 6,245,692 | B1 | | 6/2001 | Pearce et al. ................ 438/795 |
| 6,303,460 | B1 | * | 10/2001 | Iwamatsu .................... 438/401 |
| 6,340,547 | B1 | | 1/2002 | Chen et al. .................... 430/22 |
| 6,440,821 | B1 | * | 8/2002 | Conboy et al. ............. 438/462 |

FOREIGN PATENT DOCUMENTS

JP          58-004965 A    *    1/1983

* cited by examiner

Primary Examiner—Tung Q. Dang
(74) Attorney, Agent, or Firm—Thomas Schneck (57) ABSTRACT A method for preventing thermal stress and the shifting of alignment marks during semiconductor processing including providing a semiconductor wafer having a first selected portion for fabricating integrated circuitry and a second non-fabrication portion including alignment marks, introducing dopant into said first and second portions, when dopant is required to be introduced in said first portion, thereby increasing radiant energy absorptivity and decreasing radiant energy transmissivity in both portions such that the thermal emissions detected.at the portions result in no significant temperature variation between portions during heating. Therefore thermal stress and shifting of alignment marks are prevented.

30 Claims, 5 Drawing Sheets

METHOD OF PREVENTING SHIFT OF ALIGNMENT MARKS DURING RAPID THERMAL PROCESSING

FIELD OF THE INVENTION

This invention relates to a method for reducing thermal stress in a semiconductor wafer caused during rapid thermal processing.

BACKGROUND OF THE INVENTION

A major problem faced by the field of rapid thermal processing or ("RTP") has been the uniformity of heating semiconductor wafers, such as silicon wafers, treated in rapid thermal processors. A semiconductor wafer/device to be processed is placed within an RTP chamber and irradiated by a controlled radiation source, such as a lamp, so that the wafer is heated. Typically, a plurality of lamps is located within the chamber, each lamp irradiating different regions of the semiconductor device. The RTP system also includes at least one temperature sensor, sensing the thermal radiation emitted by regions of the semiconductor device. If the thermal radiation emitted by one region of the semiconductor device is greater than or less than the thermal radiation emitted by other regions, the lamps will decrease or increase the amount of radiation being emitted to that region to achieve a uniform semiconductor device temperature. An example of an RTP system is "RTP CENTURA" manufactured by Applied Materials, Inc.

In some cases, the thermal radiation emitted from some wafer regions will be substantially different from other wafer regions, though the lamps heat the regions of the wafer at an equal or substantially equal temperature. Rapid thermal processing is essentially a non-equilibrium thermal process. In particular, edge regions of a wafer contain alignment marks, are masked from process steps such as ion implantation during a stepper job, while a central region of the wafer containing product dies is processed. The processed regions are typically highly doped and are therefore opaque to radiation incident on the wafer surface and exhibit high absorption of radiant energy. Typically, for doping levels below $1 \times 10^{17}$ atoms of dopant per cubic centimeter, the semiconductor silicon is transparent or semi-transparent and absorption of irradiated energy is very low. The edge regions of the wafers, which are masked, tend to be transparent or semi-transparent and exhibit low absorption of radiant energy. The greatest radiation intensities are thus normally directed at the semiconductor's edge regions which dissipate heat more rapidly than the center of the structure. Therefore, the processed and non-processed regions will exhibit substantially different thermal characteristics though heated at the same temperature. The difference in heat emissions between regions of the wafer are sensed by the temperature sensor, which issues a signal to a controller controlling the lamps to reduce or increase power accordingly. As some regions are heated more or less than other neighboring regions, in some cases 30° C.–60° C. more, thermal stress between regions of the wafer results.

Thermal stress results in warpage, bow or flatness of the semiconductor wafer. Additionally, thermal stress may shift alignment marks that are present on the wafer. Alignment marks are critical in carrying out semiconductor processing steps through photoresist masks during a stepper job. Misalignment between semiconductor device layers created during photoresist masking steps seriously degrades the reliability of the process to perform its intended function.

The following patents describe methods for preventing heating non-uniformities and thermal stress during rapid thermal processing of a semiconductor wafer.

U.S. Pat. No. 5,399,523 to Kakoschke describes a method for rapid thermal processing of a semiconductor by electromagnetic radiation where an irradiation arrangement is provided for heating the semiconductor wafer, which is surrounded by a quartz chamber. The irradiation arrangement has a reflector design that causes the wafer to be irradiated so that a substantially identical temperature is achieved in a middle and edge region.

U.S. Pat. No. 5,851,929 to Thakur et al. describes a method for correcting the shape of a semiconductor structure. Prior to the rapid thermal processing heating step, the shape of the wafer is determined to discern whether and to what extent deformities are present in the wafer's topography. This information is used to control the heating operation. The radiation emitting zones of a heating assembly are selectively controlled to direct heat radiation of non-uniform intensities toward different regions of the structure to effect non-isothermal conditions within the structure and reduce deformities.

These patents are concerned with altering the RTP system itself or modifying a method of using the RTP system to prevent damage to, or reduce deformities of, a semiconductor substrate.

It is an object of the present invention to provide a method of semiconductor processing that will prevent thermal stress from resulting during rapid thermal processing.

It is a further object of the present invention to provide a method of semiconductor processing that will prevent shifting of alignment marks resulting from rapid thermal processing.

It is another object of the present invention to provide a method for preventing the misalignment of components and interconnection layers in the manufacture of substrates.

SUMMARY OF THE INVENTION

The above and other objects have been achieved with a method of processing a semiconductor wafer in a rapid thermal processor where, before rapid thermal processing, a first portion of the wafer, reserved for fabricating an integrated circuit, undergoes doping such that the first portion increases its absorption and decreases its transmission of radiant energy during rapid thermal processing and a second non-fabrication portion of the wafer, having alignment marks, also undergoes doping such that the second portion exhibits increased absorption and decreased transmission of radiant energy during rapid thermal processing. Therefore, no significant variation in thermal emission between portions will occur during rapid thermal processing. Accordingly, uniform heating occurs and thermal stress and shifting of alignment marks is prevented during rapid thermal processing.

This is contrary to methods of the prior art in which the first fabrication portion was doped however, the second non-fabrication portion remained undoped or was only lightly doped. Thus, significant variations in temperature distribution during rapid thermal processing resulted, causing thermal stress and shifting of alignment marks.

It is desirable that heavy doping occurs in both portions such that both first and second portions increase the amount of radiant energy absorbed and decrease the amount of radiant energy transmitted through the portions. Thus, the opacity level of both portions increases as the passage of radiant energy is blocked. Such a dopant level is typically above $1 \times 10^{-17}$ atoms of dopant per cubic centimeter. Dopants, which will increase the level of opacity, are introduced into both portions, for example, during an ion implantation step. The second non-fabrication portion is not masked during a stepper job so that it may receive the dopants. In one example, the second non-fabrication portion receives the same implant at the same dose and energy as the first fabrication portion. In another example, atoms at a dose and an energy level sufficient to cause surface level amorphization in the first fabrication portion and the second non-fabrication portion are used for doping. An equal extent of amorphous or polycrystalline layer formation may occur in each portion.

After doping occurs in both portions, the semiconductor wafer is inserted into a rapid thermal processor. The rapid thermal processor includes at least one sensor, and, in one example, a plurality of sensors, sensing the radiation emitted by the wafer. Because both the first and second portions have undergone doping, more radiant energy is absorbed and less radiant energy is transmitted at both portions. The sensor thus detects no significant variation in heat emission between the first and second portions. Therefore, the sensor will signal the radiation source to heat the portions at the same temperature, or at temperatures where no significant temperature variation between the first fabrication portion and the second non-fabrication portion results. A significant temperature variation is considered to be a temperature at which thermal stress between portions will occur. Therefore, the radiation source heats the first and second doped portions such that no significant temperature variation between portions occurs. Thus, thermal stress between the doped portions and shifting of alignment marks is prevented.

In later processing steps, semiconductor device layers are accurately aligned as alignment marks, such as global alignment marks, used for aligning the wafer to a stepper, remain in the same location or within a location that is within the correction limits of the stepper.

In one embodiment of the invention, before rapid thermal processing, the first fabrication portion undergoes doping to form source, drain and gate regions and, in accordance with the present invention, the second non-fabrication portion also undergo doping such that both portions increase their absorption levels during rapid thermal processing. Therefore, thermal stress and shifting of alignment marks within the first portion is prevented.

DETAILED DESCRIPTION OF THE INVENTION

Figure 1:
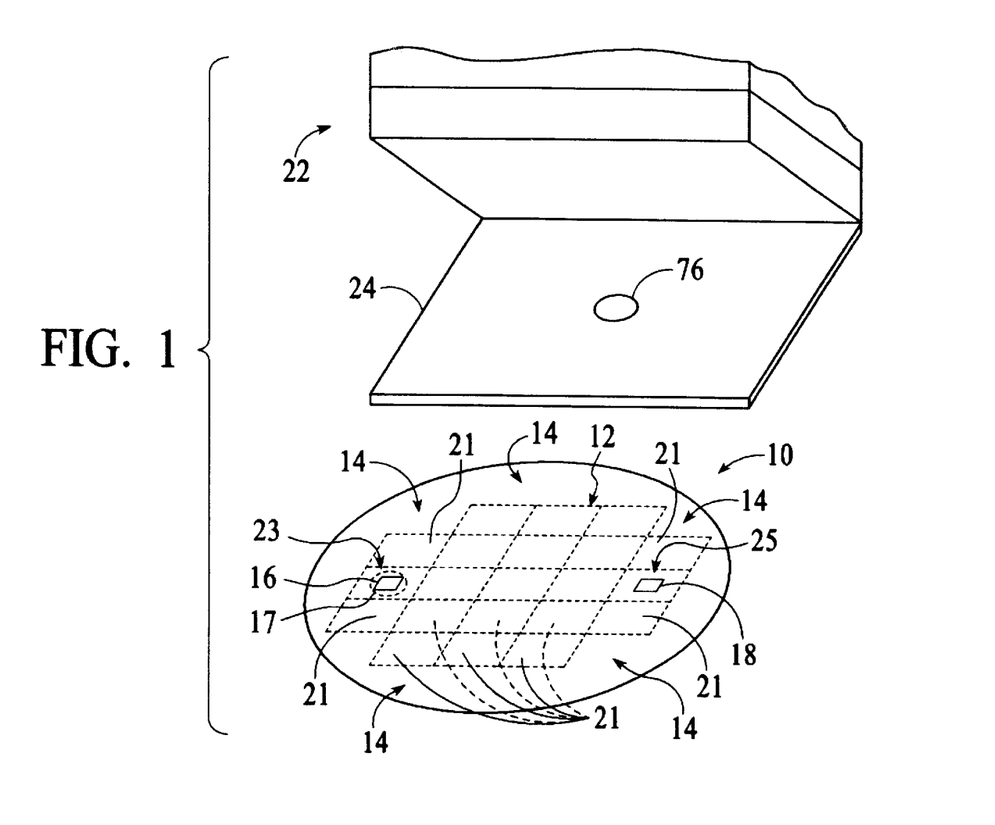
FIG. 1 is an exploded perspective view of a semiconductor wafer in operative relationship to a stepper positioned thereabove.
Figure 2:
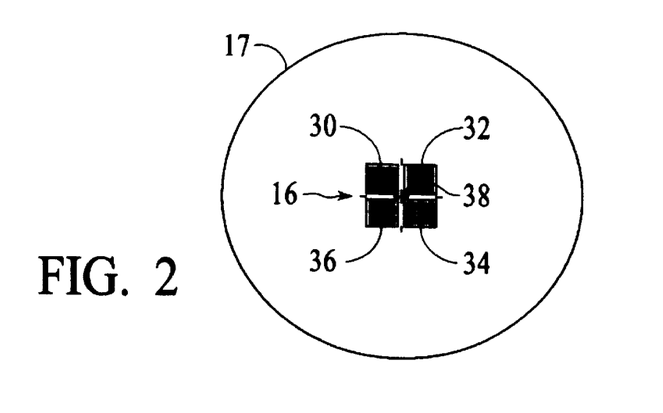
FIG. 2 is an magnified plan top view of a portion of the wafer shown in FIG. 1 depicting a set of alignment marks.

With reference to FIGS. 1 and 2 (not to scale), a semiconductor wafer 10, manufactured by the method of the present invention, having a first portion 12 selected for fabricating integrated circuitry and a second portion 14, which is a non-fabricating portion including a set of alignment marks or pattern 16, such as global alignment marks, is seen. Portions 12 and 14 may vary in size and location. Typically, the first fabricating portion 12 is disposed on a central portion of the wafer and includes dice 21 used for integrated circuit fabrication. The second non-fabricating portion 14 is disposed on edge portions of the wafer and may include non-fabrication die 23, as well as any other non-fabrication dice and other portions of the wafer not used for integrated circuit fabrication. Non-fabricating portion 14 may be disposed on other locations or other edge locations that are not used for fabrication of integrated circuitry. In accord with the present invention, the first and second portions 12 and 14 of the wafer 10 have been doped during semiconductor processing such that both portions, not only the first portion, exhibit an increased level of absorptivity of radiant energy, such as electromagnetic energy, and a decreased level of transmissivity of radiant energy during rapid thermal processing. Both portions are thus opaque to at least some radiant energy incident on the wafer surface and block the passage of such energy through the portions. Therefore, as will be described below, thermal stress is prevented during rapid thermal processing.

With reference to FIG. 1, it is desirable that at least another wafer alignment pattern 18 within another non-fabrication die 2,5 of the non-fabrication portion 14 of the wafer 10 is used in conjunction with the present invention. Non-fabrication die 25 is processed as is the remainder of non-fabrication portion 14, according to the method of the present invention. Specifically, die 25 is doped to increase its absorptivity of radiant energy and decrease its transmissivity of radiant energy, as is non-fabricating portion 14, when fabricating portion 12 is required to undergo doping. The method steps of the present invention will be discussed below with regard to only one set of alignment marks 16, though the method steps can be applied to a second set of global alignment marks 18, if present, within non-fabrication die 25, as well as to additional sets of alignment patterns, within the non-fabrication portion 14, if present. In one example, fabrication dice 21 comprise all dies except for non-fabrication dice 23 and 25. Fabrication dice 21 may include any desired dice. Field alignment marks and field scribe lines forming a grid pattern that define individual fields may also be present on the wafer 10, however, are not shown here.

With reference to FIGS. 1 and 2, in the method of the present invention, a number of alignment marks 16 are scribed or etched within the non-fabricating portion 14, specifically die 23, by methods known in the art. In a magnified view seen in FIG. 2, magnified portion 17 of die 23 is seen to include alignment pattern 16. Pattern 16 is square and is comprised of four square discrete or sub-discrete alignment patterns 30, 32, 34 and 36. A central (+) mark 38 is provided. Different alignment patterns may be employed.

Alignment marks 16 provide a frame of reference so that the wafer 10 can be properly aligned in a selected processing apparatus such as an imagining step machine or stepper 22, also known in the art. The alignment marks 16 are initially employed to allow proper positioning of the wafer 10 relative to the imaging stepper 22, and particularly an alignment recticle 24, which forms a part of the stepper 22 and which is disposed in an optical projection path (not seen) above the wafer 10. The alignment recticle 24 is used to view the alignment marks 16 scribed on the wafer 10, thereby permitting the wafer 10 to be properly aligned beneath the stepper 22, in readiness for further processing. The recticle 24 will be discussed below in conjunction with the method steps of the present invention.

Figure 3:
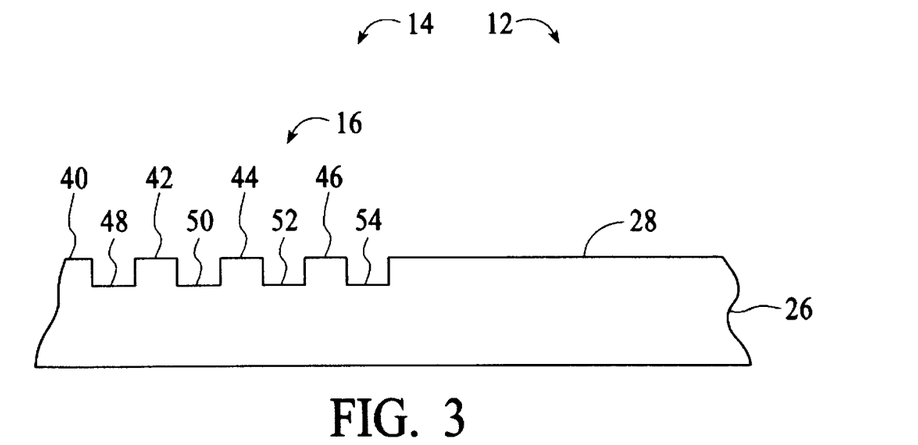
FIG. 3 is a side plan view of a portion of the semiconductor wafer of FIG. 1 pre-doping.

With reference to FIG. 3 (not to scale), wafer alignment pattern 16 is patterned relative to a bulk of silicon wafer 26 having a main surface 28. The bulk of silicon wafer 26 is typically monocrystalline silicon or includes an epitaxial layer formed on a semiconductor substrate in accordance with conventional practices. Alignment pattern 16 is discretely located in the non-fabricating portion 14.

It is seen that the set of alignment marks 16 includes a plurality of sections 40, 42, 44 and 46 substantially flush or coplanar with the main surface 28 and a plurality of trenches 48, 50, 52 and 54 separating the sections. The dimensions and orientation of the sections and trenches are determined in a particular situation based upon the particular stepper 22 employed. Typically adjacent sections 40, 42, 44 and 46 and trenches 48, 50, 52 and 54 are substantially parallel or orthogonal to one another, and trenches are approximately rectangular. Sections and trenches typically have a width of about a few $\mu$m and trenches have a depth of about 1000–3000 Å.

Figure 4:
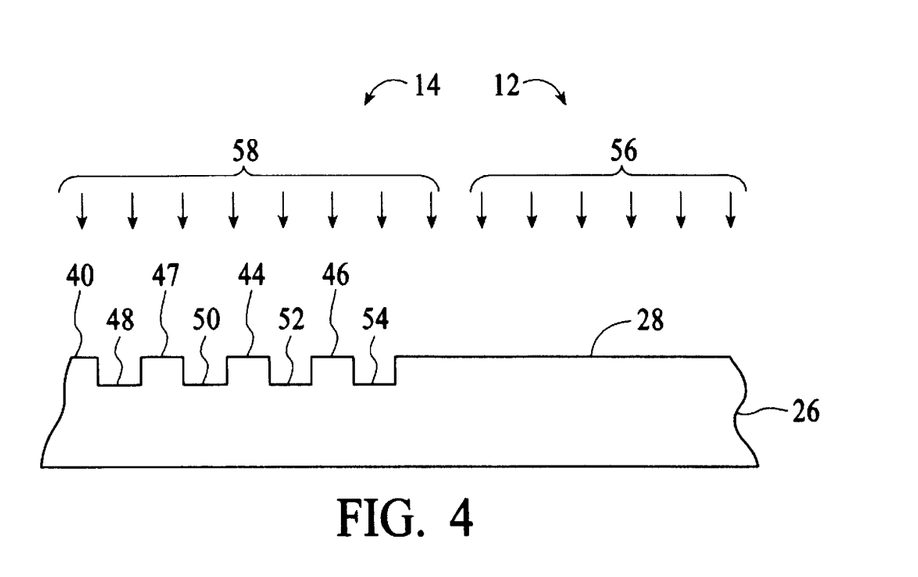
FIG. 4 is a side plan view of the semiconductor wafer of FIG. 3 during a doping step in accord with the present invention.

With reference to FIG. 4, during typical semiconductor wafer 10 processing, the first fabrication portion 12 undergoes doping for fabrication of integrated circuitry. Dopants 56 could include well implants, buried implants or other implants required for fabrication of integrated circuitry and as are used in the art. The doping increases the radiant energy absorption level of the first portion 12 thus increasing the opacity level, and decreasing the radiant energy transmissivity level during rapid thermal processing. Typically, high doping levels are necessary to achieve an absorption increase of radiant energy and a transmissivity decrease of irradiated energy within the wafer 10 during rapid processing. A high or heavy doping level is typically above $1 \times 10^{-17}$ atoms of dopant per cubic centimeter. Dopants may include p type or n type ions.

Several techniques known in the art are available to introduce dopants 56. Of these techniques, ion implantation is the most common. Here, dopants 56 are injected into semiconductor surface 28 at an energy and dose sufficient to achieve desired junction depths. Implant energies vary with the type of ion being implanted.

In one example, when a high dose implant is used, surface level amorphization occurs in the first portion 12 of the wafer 10 to alter the transmissivity and absorptivity properties of the first portion 12. Heavy atom implants cause surface level amorphization, as is known in the art.

In accordance with the method steps of the present invention, when the fabrication portion 12 undergoes doping at a level sufficient to cause an increase in the absorptivity level of the first portion during rapid thermal processing and a decrease in the transmissivity level, so does the non-fabrication portion 14. This is contrary to the prior art where the non-fabrication portion was masked and thus remained undoped or lightly doped at a level insufficient to increase absorptivity and decrease transmissivity of radiant energy, while the first portion was doped at a high dosage. Doping of the second non-fabrication 14 portion may occur simultaneously or sequentially with regard to doping of the first portion 12 selected for fabricating integrated circuitry.

During a stepper process, and where implants are to be introduced into the first portion 12, the stepper 22 is programmed such that the non-fabricating portion 14, in addition to at least some portions of fabricating portion 12, is not masked during introduction of dopants 58. Thus, the exposed non-fabrication portion 14 receives dopants, along with the first portion 12. In the prior art the non-fabrication portion 14 was masked, for example with a photoresist mask, thus it did not receive dopants.

The dopants 58 cause an increase in the absorption level of the second portion 14 thus increasing the second portion opacity level and decreasing its transmissivity level during rapid thermal processing. As stated above, it is typical that high or heavy doping levels greater than, for example, $1 \times 10^{-17}$ cm$^{-3}$ are necessary to increase the absorptivity level. However, the dopant levels required to increase absorptivity and decrease transmissivity is dependent on the underlying transmission properties of the first and second portions that exist prior to doping. In one example, dopants 58 are implanted through ion implantation into the second portion 14 at an energy and dose sufficient to cause an increase in the absorption level of the second portion 14 and to reduce its transmissivity level during rapid thermal processing, if the first portion 12 was or is to be heavily doped. The increase in absorptivity or corresponding decrease in transmissivity need not be identical in both portions 12 and 14.

Arsenic, boron and phosphorus are examples of dopants that may be used. In one example, the entire non-fabrication portion 14 receives the same dopant or implant that is received by the first portion 12 at the same dose and energy. For instance, the first portion 12 may receive a dose of $1 \times 10^{16}$ arsenic atoms 56 per square centimeter at 40–70 keV and the second non-fabrication portion may receive dopants 58 that are of the same dose, type and energy range. Alternatively, $1 \times 10^{15}$ boron atoms per square centimeter at 50–70 keV or $5 \times 10^{15}$ atoms of phosphorous per square centimeter at 60–80 keV may be used as the dopants in both the first and second portions. The second portion 14, in one example, receives a dopant, different from the dopant used to dope the first portion 12, that will increase the absorptivity level of the second portion 14 and thus decrease the transmissivity level. In one example, the first portion 12 is doped with a heavy ion 56 at a certain energy level and dose and the second portion 14 is doped with a heavier ion 58 at a lower energy level and dose or vice versa. For instance, the first portion 12 may be doped with a dose of $1 \times 10^{16}$ cm$^2$ arsenic atoms at an energy of 50–70 keV and the second non-fabrication portion 14 may be doped with a dose of $1 \times 10^{15}$ cm$^2$ boron atoms at an energy of 50–70 keV. The dose, energy and type of atoms used for doping the first and second portions result in at least $1 \times 10^{17}$ atoms per cubic centimeter within both the first and second portions.

Surface level amorphization may occur during doping to alter the thermal properties of the wafer 10. It is desirable that surface amorphization occurs in the second portion 14 when the first portion 12 has undergone surface amorphization. In one example, the surface level amorphization occurs at an equal depth in both the first fabrication portion 12 and the second non-fabrication portion 14.

Figure 5:
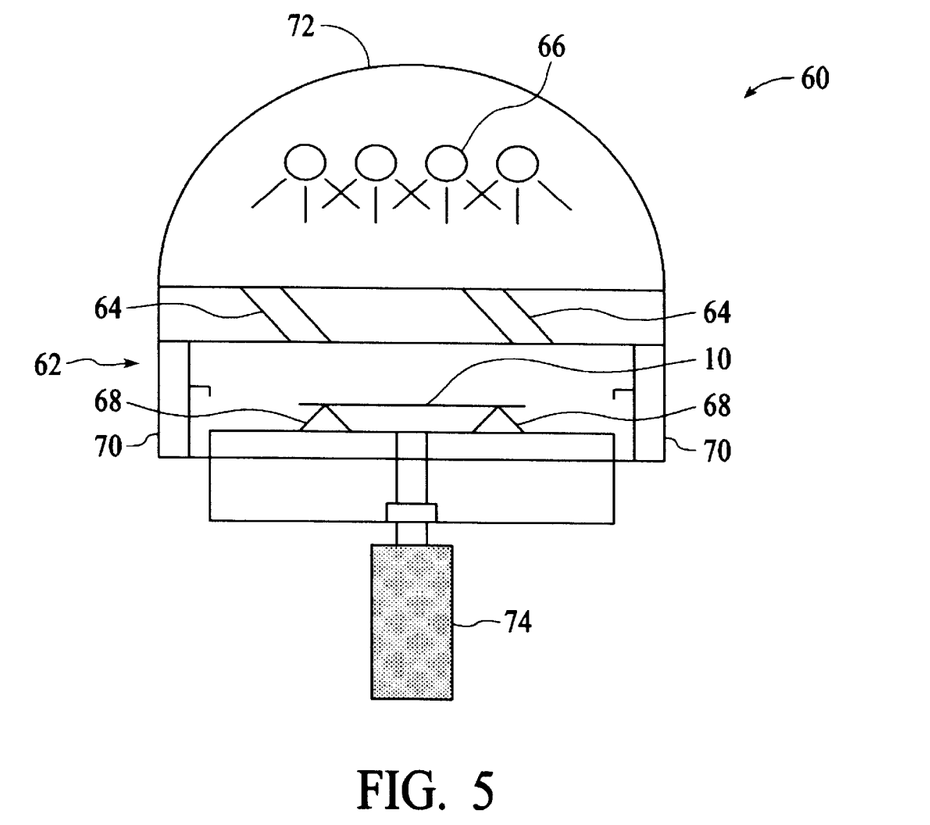
FIG. 5 is a side plan view of the semiconductor wafer of FIG. 1 prepared according to the method of the present invention and inserted within a rapid thermal processor.

The wafer 10, having been doped with dopants 56 and 58 in both the first and second portions 12 and 14 as described above, is inserted within a rapid thermal processor 60, known in the art, and as seen in FIG. 5. In the processor 60, the dopants 56 and 58 are activated by annealing. Annealing times vary depending on the implant energy, the dose used and the types of ions implanted. Single wafer 10 is quickly heated by absorption of radiant energy during the rapid-thermal processing under atmospheric conditions or at low pressure. A processing chamber 62 is made from, for example, quartz, silicon carbide, or stainless steel. Chamber 62 includes quartz windows 64 through which the radiation, such as electromagnetic radiation, from lamps 66 passes to irradiate wafer 10. Wafer 10 is for example held on thin quartz pins 68 in thermal isolation inside chamber 62. An ambient atmosphere inside chamber 62 is controlled by gas flow through the chamber. Gas flows into the chamber from at least one gas inlet 70. Sensor controlled lamps 66 disposed at various locations within the chamber 62, heat regions of the wafer 10 through the windows 64. Regions of the wafer are located within first fabricating portion 12 and second non-fabricating portion 14. Reflectors 72 may assist the lamps 66 in heating. Typically, a temperature sensor 74, such as an optical pyrometer, determines the temperature from radiated infrared energy on the back of the wafer 10. One or more sensors 74 may be used. The rapid thermal processor 60 includes a computer controller (not shown) that controls system operation.

The temperature sensor 74, of the rapid thermal processor 60, is placed in a control loop to detect wafer temperature. If the sensor 74 is located under a region of the wafer 10 where alignment marks 16 of the second non-fabrication portion 14 are located, it will sense a relatively low temperature or decreased level of thermal emissions at that portion of the wafer, as that portion has undergone doping as described above. The temperature of portion 14 is detected as being low, compared to the prior art, where portion 14 was not doped or was only lightly doped. This is because the transfer of heat between objects is a function of their radiant energy transmissivity and .absorptivity characteristics which were altered when portion 14 was doped.

As the first portion 12 has also undergone doping, as described above, the sensor 74 will sense a relatively low temperature or decreased level of thermal emission also. As the first fabrication portion 12 and the second non-fabrication portion 14 are both doped to increase absorptivity and decrease transmissivity of radiant energy, approximately the same level of heat is emitted from these portions. Therefore, no significant variation in temperature is detected between portions. A significant temperature variation between portions is considered to be a temperature at which thermal stress between portions or over said wafer will occur. Thermal stress results in deformation of the wafer. Thus, the sensor 74 detects a temperature or temperatures (or thermal emissions) of the first and second doped portions 12 and 14 having no significant variation. The amount, dose, and energy of dopant for each portion 12 and 14 results in an increase in radiant energy absorptivity, thus decrease in radiant energy transmissivity. This can be achieved by doping the first and second portion such that $1 \times 10^{17}$ dopants/cm$^3$ result in each portion. By changing the absorptivity and transmissivity properties, equal temperatures, or substantially equal temperatures having no significant temperature variation result with respect to the fabrication portion 12 and non-fabrication portion 14. As long as both portions have been doped to increase radiant energy absorptivity, and thus decrease transmissivity no significant temperature difference between portions will be detected.

Because there is no substantial difference in thermal emission between the portions 12 and 14, the sensor 74 issues a signal to the computer controller (not shown), which is controlling the lamps 66, to reduce or increase power intensity equally or substantially equally with regard to portions 12 and 14. In other words, the controller will signal the lamps 66 to heat each portion 12 and 14 to the same temperature or to temperatures that do not significantly vary between the first and second portions. Temperation variation is dependent upon the radiation transmission properties of the underlying first portion 12 and second portion 14.

Typically, the method of the present invention is used in conjunction with wafers having dice such as 21, 23 and 25 (FIG. 1) in the range of a few to several millimeters. For example, wafers having dice that range from $2 \times 3$ mm$^2$ to $20 \times 20$ mm$^2$ are used. Generally, the non-fabrication portion 14 of a wafer is about the same area or is greater than the area of each die, depicted in FIG. 1.

In the prior art, wafers exhibit large discrepancies in temperature between fabrication portion 12 and non-fabrication portion 14 during rapid thermal processing as portion 12 undergoes doping while portion 14 does not. Where, in the prior art, adjacent portions of wafers, being about a few millimeters in size, are heated at different temperatures thermal stress tends to result. Greater temperature variation results between portions that are larger in size as the fabrication portion is doped and the non-fabrication portion is not. Therefore, greater thermal stress results in larger sized portions. For example, a temperature differential of greater than 30° C., or between 30° C.–40° C. between portions may result in the prior art. This is a significant temperature variation causing thermal stress. In contrast, in the present invention, portions 12 and 14 are heated at a temperature or temperatures having no significant variation, as described above, so thermal stress is prevented.

A key advantage of this invention over the prior art is that the non-fabrication portion 14 is modified to include a dopant to increase the portion's ability to absorb heat. This is in addition to the first fabrication portion 12 receiving a dopant increasing its ability to absorb heat. Therefore, portions 12 and 14 will be heated at temperatures that will not result in thermal stress between portions or thermal stress sufficient to shift alignment marks.

In the prior art, the second portion 14 is not doped though the first portion 12 is. Therefore, upon insertion into the rapid thermal processor 60 significant variations in temperature are detected between the first and second portions 12 and 14 and the portions are thus heated at temperatures that vary significantly resulting in thermal stress, which leads to shifting of alignment marks.

In the present invention, thermal stress is prevented as significant temperature variations during rapid thermal processing heating are avoided. Therefore, shifting of alignment marks located on the second non-fabrication portion 14 is prevented. In one example, thermal stress is not completely prevented and may still occur, however is not sufficient to shift alignment marks, or to shift alignment marks beyond the correction limit of the stepper 27. Accordingly, in later processing steps, semiconductor device layers are accurately aligned as alignment marks 16, used for aligning the wafer 10 to the stepper 22 (FIG. 1) or other imaging machine and/or for aligning layers to one another, remain in the equal location or within a location that is within the correction limits of the stepper 22.

After being processed in the rapid thermal processor 60, additional individual circuit components and interconnections are conventionally formed using photolithographic techniques. Referring back to FIG. 1, the recticle 24 of the stepper 22 includes a centrally located alignment pattern 76, which is a mirror image of alignment pattern 16, such as a global alignment pattern. Other indicia such as further alignment mark patterns may be incorporated into the recticle 24 as required. The stepper 22 uses a laser beam with a fixed wavelength (not shown) to sense the position of the alignment marks 16 on the wafer by using the alignment marks 16 as a reference point. Specifically, the alignment recticle 24 is used to properly position the wafer beneath the stepper 22 using the alignment marks 16 scribed on the wafer 10 and the alignment pattern 76 of the recticle 24, thereby permitting the wafer to be properly aligned in readiness for further processing. The alignment marks 16 are employed to adjust the wafer 10 to precisely align it with a previous layer on the wafer. Interference from the alignment marks 16 is reflected back to detecting devices in the stepper 22. One or more layers of patterned material (not shown) may then be formed on the surface 28 (FIG. 3) by methods known in the art, such as with a layer of photoresist and a photoresist mask. The present invention prevents shifting of alignment marks during rapid thermal processing or at least prevents an amount of shifting from occurring during rapid thermal processing that is beyond the correction limits of the stepper.

Referring to FIGS. 6A–6G (not to scale), another example of the present invention, is seen. Source, drain and gate regions are formed and doping occurs in the first fabrication portion, as well as the second non-fabrication portion. As stated above this causes an increase in the radiant energy absorption level during rapid thermal processing, thus decrease in detected thermal emissions, in both portions. Therefore, neither portion exhibits a significant variation in temperature and are thus are both heated to temperatures that do not significantly vary thereby preventing thermal stress.

Figure 6A:
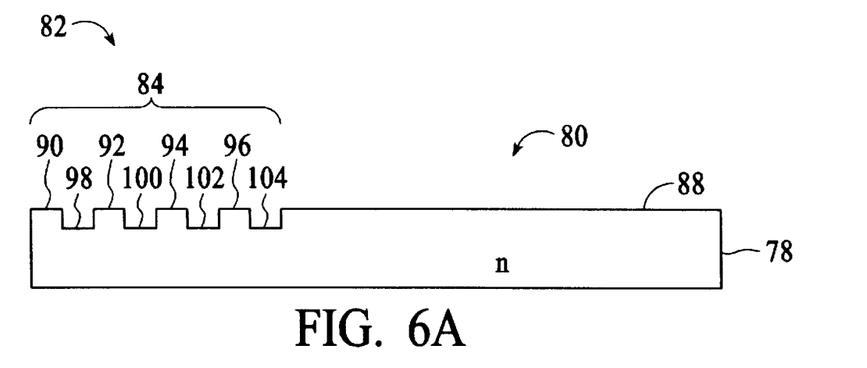
FIGS. 6A–6G are side views of a portion of a wafer being patterned and doped according to a method of the present invention.

A wafer 78, having a first integrated circuit fabrication portion 80, and a second non-fabrication portion 82 having alignment marks 84, such as global alignment marks, etched or scribed within it, is seen in FIG. 6A.

Figure 6B:
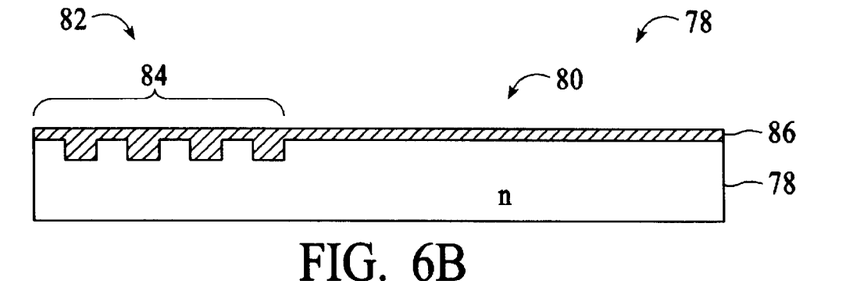

Referring to FIGS. 6A and 6B it is seen that a sacrificial oxide layer 86 is formed on a surface 88 of the first fabrication portion 80, on the surfaces 90, 92, 94 and 96 and within the trenches 98, 100, 102 and 104 of the second non-fabrication portion 82.

Figure 6C:
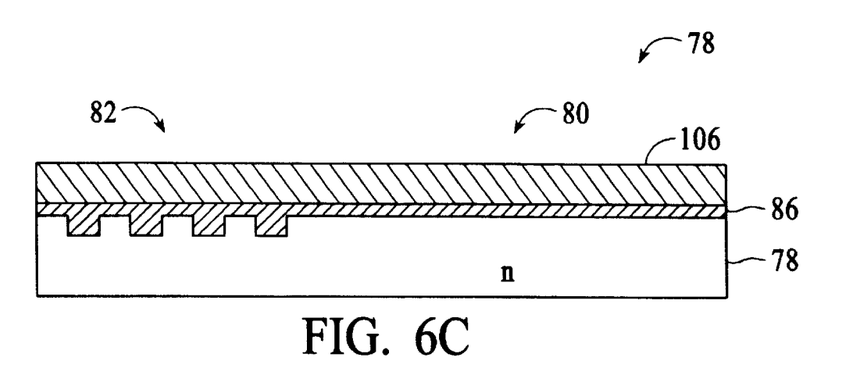
Figure 6D:
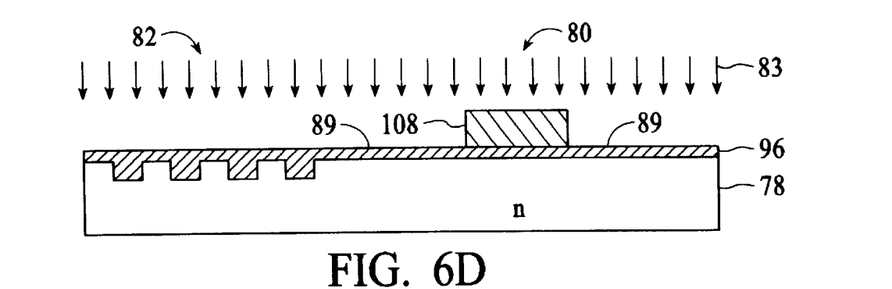

Next, as seen in FIG. 6C, a gate material 106 for example, a polysilicon layer, is applied over the oxide layer 86. The polysilicon layer 106 is then patterned, as seen in FIG. 6D and as known in the art, such that portions of the oxide 86 are exposed and a polysilicon island 108 remains. Exposed oxide portions 89 are found within the first and second portions 80 and 82. The wafer 78 is then doped or implanted with ions 83, through the exposed oxide 89 to dope the source and drain extension regions in the first fabrication portion 80 and second non fabrication portion 82 including alignment marks 84. The gate material 108 stops the ions 83 from being implanted in the wafer material under the gate material 108. The second non-fabrication portion 82 is not masked and is doped in accordance with the present invention and as described above. The dopants 83 are introduced at an energy and dose in both portions such that both the first fabrication portion 80 and the second non-fabrication portion 82 exhibit an increased level of radiant energy absorptivity during rapid thermal and thus a decreased level of transmissivity. Therefore, portions 80 and 82 exhibit no significant variation in temperature.

Figure 6E:
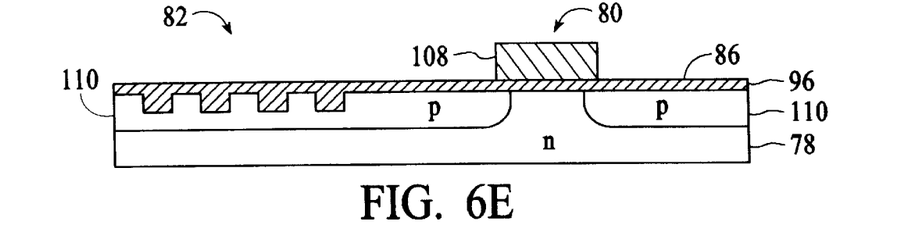

With reference to FIG. 6E, it is seen that p type regions 110 are formed within the first portion 80 and the second portion 82 when the implant is of a p type dopant ion. Conversely, the wafer could be of a p type and n type dopants could be implanted.

Figure 6F:
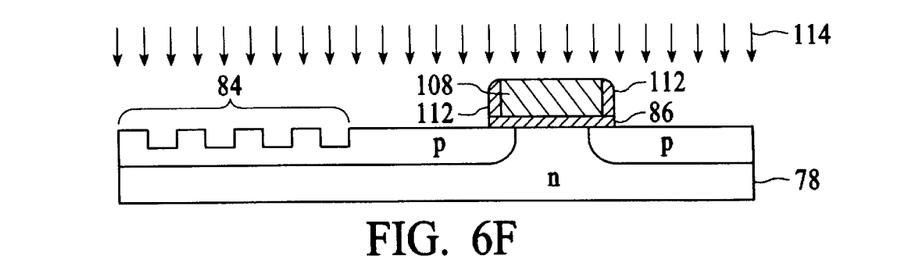
Figure 6G:
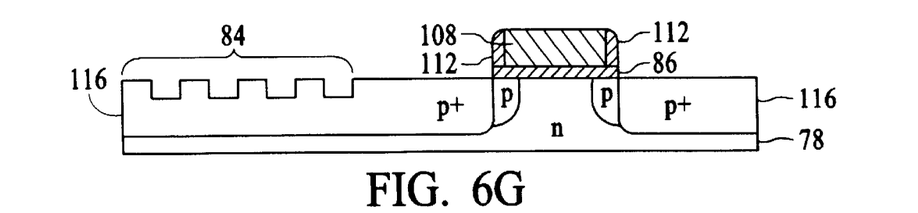

With reference to FIG. 6F the wafer 78 is seen after a blanket oxidation and an etch of the oxide 86. Sidewalls 112 of oxide are left on the gate material 108. Dopants 114 are shown being introduced or implanted to form source and drain regions 116. In accord with the present invention, dopants 114 are introduced into both portions 80 and 82 at an energy and dose sufficient to increase radiant energy absorptivity and decrease radiant energy transmissivity during rapid thermal processing. Wafer regions beneath the polysilicon island 108 fail to receive implant 114.

During processing, the wafer 78 is inserted within the rapid thermal processor 60, as seen in FIG. 5. The wafer can be inserted in the rapid thermal processor after one or more doping steps have occurred. Thermal stress and shifting of alignment marks is prevented, as the sensor 74 will detect the same or substantially the same amount of thermal emission from the portions 80 and 82 during rapid thermal processing. The lamps 66 heat the portions 80 and 82 to a temperature or temperatures where thermal stress is prevented or at least prevented to a degree such that shifting of alignment marks 84 is also prevented.

What is claimed is:

1. A semiconductor wafer processing method for preventing shifting of alignment marks comprising:

providing a semiconductor wafer having a first portion for fabricating integrated circuitry and a second non-fabrication portion including alignment marks;

introducing dopants into said first portion, such that radiant energy absorptivity of said portion increases and radiant energy transmissivity decreases;

introducing dopants into said second portion, such that radiant energy absorptivity of said portion increases and radiant energy transmissivity decreases; and inserting said wafer into a rapid thermal processor, detecting thermal emissions from said first and second doped portions at said rapid thermal processor, and heating said first and second doped portions such that thermal stress over said wafer and shifting of said alignment marks is prevented.

2. The method of claim 1 wherein said dopants are of the same type and dose.

3. The method of claim 1 wherein said dopants are introduced into said first and second portions at a level greater than $1 \times 10^{-17}$ dopants per cubic centimeter.

4. The method of claim 1 further comprising introducing said dopants through ion implantation.

5. The method of claim 4 wherein said dopants are implanted at an equal intensity and equal dose into said first and second portions.

6. The method of claim 1 wherein surface amorphization results in said first and second portions after introduction of dopants.

7. The method of claim 1 wherein surface amorphization occurs to an equal depth in both portions.

8. The method of claim 1 wherein said doping occurs simultaneously.

9. The method of claim 1 wherein said dopant is selected from the group consisting of arsenic, boron and phosphorous.

10. The method of claim 1 further comprising removing said wafer from said rapid thermal processor and aligning said alignment marks with a stepper alignment pattern during a stepper job.

11. The method of claim 1 further comprising masking select regions of said first portion and exposing non-select regions of said first portion and non-select regions of said second portion to dopants during a stepper job.

12. The method of claim 11 further comprising programming a stepper to prevent masking of said doped portions.

13. The method of claim 1 further comprising said alignment marks remaining in a equal location of said first portion after said rapid thermal processing.

14. The method of claim 1 further comprising said alignment marks remaining disposed in said first portion in a location that is not beyond a correction limit of a stepper.

15. The method of claim 1 wherein said first and second portions are processed at a temperature preventing significant temperature variation between portions from occurring.

16. The method of claim 1 wherein said dopants are introduced at the same energy level.

17. The method of claim 1 wherein said dopants are dopant ions.

18. The method of claim 1 further comprising etching global alignment marks into said second portion.

19. The method of claim 1 wherein said alignment marks comprise a plurality of trenches.

20. The method of claim 1 further comprising activating said dopants by annealing in said rapid thermal processing chamber.

21. A semiconductor wafer processing method for preventing shifting of alignment marks:

providing a semiconductor wafer having a first portion for fabricating integrated circuitry and a second non-fabrication portion having alignment marks;

forming a sacrificial oxide layer on said first and second portions;

forming a conducting gate material on said sacrificial layer;

patterning said gate material such that exposed oxide regions are formed within said first fabrication portion and said second non-fabrication portion;

introducing dopants into said exposed regions, such that radiant energy absorptivity of said exposed regions increases and radiant energy transmissivity of said exposed regions decreases;

removing exposed portions of said sacrificial oxide layer; and inserting said wafer into a rapid thermal processor, detecting thermal emissions from said exposed regions at said rapid thermal processor and heating said first and second portions such that thermal stress over said wafer and shifting of said alignment marks is prevented.

22. The method of claim 21 further comprising introducing additional dopants into said first and second portions after removing said sacrificial oxide layer.

23. The method of claim 21 further comprising patterning said gate material such that said gate material remains on selected regions of said first portion and is removed from non-selected regions of said first portion and said second portion, thus exposing non-selected regions of said first and second portions, including alignment marks.

24. The method of claim 21 wherein surface amorphization results in said exposed portions after introduction of said dopants.

25. The method of claim 21 wherein introducing dopants occurs by ion implantation.

26. The method of claim 21 wherein said portions are heated to a temperature preventing significant temperature variation between portions from occurring.

27. The method of claim 21 wherein an energy, type and dose of dopants introduced in said exposed region of said first portion is equal to an energy, type and dose of dopants introduced in said second portion.

28. The method of claim 21 wherein said alignment marks comprise a plurality of trenches.

29. The method of claim 21 further comprising doping said portions simultaneously.

30. A semiconductor wafer processing method for preventing shifting of alignment marks:

providing a semiconductor wafer having a first doped portion for fabricating integrated circuitry and a second doped non-fabrication portion including alignment marks, said doped portions exhibiting an increase in radiant energy absorptivity and a decrease in radiant energy transmissivity during rapid thermal processing; and inserting said wafer in a rapid thermal processor, detecting thermal emissions from said doped portions at said rapid thermal processor and heating said first and second doped portions such that thermal stress over said wafer and shifting of said alignment marks is prevented.

* * * * *